United States Patent
Overweg

(10) Patent No.: US 10,794,973 B2
(45) Date of Patent: Oct. 6, 2020

(54) MAGNET SYSTEM WITH THERMAL RADIATION SCREEN

(71) Applicant: KONINKLIJKE PHILIPS N.V., Eindhoven (NL)

(72) Inventor: Johannes Adrianus Overweg, Uelzen (DE)

(73) Assignee: Koninklijke Philips N.V., Eindhoven (NL)

( * ) Notice: Subject to any disclaimer, the term of this patent is extended or adjusted under 35 U.S.C. 154(b) by 0 days.

(21) Appl. No.: 16/324,589

(22) PCT Filed: Aug. 15, 2017

(86) PCT No.: PCT/EP2017/070659
§ 371 (c)(1),
(2) Date: Feb. 11, 2019

(87) PCT Pub. No.: WO2018/033530
PCT Pub. Date: Feb. 22, 2018

(65) Prior Publication Data
US 2019/0187228 A1     Jun. 20, 2019

(30) Foreign Application Priority Data
Aug. 15, 2016  (EP) ................................. 16184165

(51) Int. Cl.
*G01R 33/38*     (2006.01)
*H01F 6/04*      (2006.01)
*G01R 33/3815*   (2006.01)

(52) U.S. Cl.
CPC ..... *G01R 33/3804* (2013.01); *G01R 33/3815* (2013.01); *H01F 6/04* (2013.01)

(58) Field of Classification Search
CPC .... G01R 33/3804; G01R 33/2815; H01F 6/04
See application file for complete search history.

(56) References Cited

U.S. PATENT DOCUMENTS

| | | | |
|---|---|---|---|
| 4,694,663 A | 9/1987 | Miller | |
| 5,225,782 A * | 7/1993 | Laskaris | G01R 33/3815 324/318 |
| 5,317,879 A | 6/1994 | Goldberg et al. | |
| 5,406,204 A | 4/1995 | Morich et al. | |
| 5,559,984 A | 9/1996 | Nakano et al. | |
| 5,651,256 A | 7/1997 | Herd et al. | |
| 2006/0084332 A1 | 4/2006 | Muschelknautz et al. | |
| 2009/0193818 A1 | 8/2009 | Tigwell et al. | |
| 2010/0200594 A1 | 8/2010 | Husband et al. | |
| 2011/0133871 A1 | 6/2011 | Stautner et al. | |
| 2012/0108433 A1 | 5/2012 | Jiang et al. | |

(Continued)

FOREIGN PATENT DOCUMENTS

| | | | |
|---|---|---|---|
| JP | 59134843 A | 8/1984 | |
| JP | 62165901 A | 7/1987 | |
| JP | 0582333 A | 4/1993 | |

*Primary Examiner* — Gregory H Curran

(57) ABSTRACT

A radiation screen comprising the elongate thermal conductors which reduce temperature gradients along the radiation screen and do no support electrical eddy currents. The radiation screen is easy to manufacture, does not require additional mechanical support and does not generate mechanical resonances so that the heat load onto the cold mass remains low.

18 Claims, 4 Drawing Sheets

(56) References Cited

U.S. PATENT DOCUMENTS

2012/0184444 A1\* 7/2012 Blumenthal ....... G01R 33/3854
                                                     505/162
2015/0338151 A1   11/2015 Miki \* cited by examiner

MAGNET SYSTEM WITH THERMAL RADIATION SCREEN

CROSS REFERENCE TO RELATED APPLICATIONS

This application is a U.S. national phase application of International Application No. PCT/EP2017/070659, filed on Aug. 15, 2017, which claims the benefit of EP Application Serial No. 16184165.5 filed on Aug. 15, 2016 and is incorporated herein by reference.

FIELD OF THE INVENTION

The invention pertains to a magnet system for a magnetic resonance examination system. The magnetic system comprises main magnet coils with superconducting windings. The main magnet coils are surrounded by a thermal radiation screen. A refrigeration system is provided to cool the magnet coil windings to below their superconductivity critical temperature.

The invention also pertains to a thermal radiation screen for a main magnet system for a magnetic resonance examination system.

BACKGROUND OF THE INVENTION

From the U.S. Pat. No. 5,651,256 a superconductive magnet is known that has a superconductive coil surrounded by a thermal shield surrounded by a vacuum enclosure. The thermal shield may have several flexible layers of thermally conductive material. Most of the weight of the thermal shield is supported by flexible thermal insulation blankets which surround the superconductive coil. The British patent application GB 2 467 596 discloses a thermal radiation screen for a cryostat. This known thermal radiation screen is made of a conductive filler material of chopped metal fibres embedded in an insulating plastic material. The metal fibres from electrically conductive tracks. This achieves to provide the required heat conduction, whilst minimising the generation of eddy currents. The European patent application EP 1 596 121 discloses a thermal shield with heat conducting bodies formed from a glass fibre filler with elongate metal elements.

SUMMARY OF THE INVENTION

An object of the invention is to provide a thermal radiation screen that reduces thermal dissipation into the magnet system's cold mass. This object is achieved according to the invention by a thermal radiation screen for a magnet system comprising a multitude of overlapping elongate thermal conductors. Another object of the invention is to provide a superconductive magnet system in which thermal dissipation into the magnet system's cold mass is reduced. This further object of the invention is achieved the magnet system for an magnetic resonance examination system, the magnet system of the invention comprising:
  main magnet coils with coaxial windings to generate a main magnetic field in the magnetic resonance examination system's examination zone,
  a refrigerator having a cold head to cool the main magnet coil windings below critical temperature for superconductivity,
  a thermal radiation screen surrounding the main magnet coils,
  a thermal intercept arranged forming a thermal path between the thermal radiation screen and the refrigerator, the thermal intercept being thermally connected at several positions to the radiation screen.

The magnet system of the invention is defined in claim 5.

The overlapping elongate thermal conductors, notably strips, tapes or wires have an anisotropic thermal and electrical conductivity that is much higher along the elongate conductors than transverse to the elongate conductors. The thermal conductivity reduces temperature gradients due to radiation heat from the magnet's warm surface reaching the radiation screen. The anisotropic electrical conductivity suppresses the generation of eddy currents by the external field of the gradient coil; then unwanted magnetic fields are suppressed in the imaging volume of the MRI scanner, which would interfere with the spatial encoding of the radio frequency magnetic resonance signals from an object to be examined acquired in the magnetic resonance examination system. Preferably one or even better multiple thermal links between the radiation screen and a refrigerator carry-off heat from the radiation screen.

In brief, the radiation screen comprising the elongate thermal conductors which reduce temperature gradients along the radiation screen and do no support electrical eddy currents. The radiation screen is easy to manufacture, does not require additional mechanical support and does not generate mechanical resonances so that the heat load onto the cold mass remains low.

In a preferred embodiment of the radiation screen (a) electrically non-conducting opaque layer(s) (is) are arranged in between or covering the overlapping elongate thermal conductors. The layers may have some thermal conductivity, but the layers' electrical conduction properties suppress electrical eddy currents. The opaque layers are opaque, i.e. non-transparent in the infrared wavelength range. These opaque layers prevent heat being irradiated into the superconducting windings of the magnet coils. These opaque layers cover openings that may be left between the elongate thermal conductors and through which radiation could penetrate and cause deposition of power into the magnet's cold mass. The thermally conducting opaque layer is in thermal contact with the elongate thermal conductors. In this way it is avoided that the opaque layers do not become warmer than the adjacent thermally conducting layer. This further reduces the temperature gradient along the radiation screen. The thermally non-conducting opaque layer may be formed by disposing elongate thermal insulators over a continuous opaque sheet. This is simple to manufacture. The opaque layer can be just a single sheet supporting itself.

In a further preferred embodiment of the radiation screen a fabric is applied that is formed from elongate thermally conductive fibres and thermally insulating fibres. The elongate thermal fibres are orientated transverse to the electrically insulating fibres. The elongate thermally conductive fibres achieve low temperature gradients along the radiation screen. Because the thermally conductive fibres are electrically insulated from each other, eddy currents are effectively suppressed.

The magnet system of the invention is provided with one or even preferably more thermal intercepts that form thermal paths to the refrigerator. Preferably, the refrigerator may be a multi (two) stage cooling system. The thermal path preferably is established between the radiation screen and one of the cooling stages. It may be preferred to couple the thermal path to one of the cooling stages, that may not even be the cooling stage with the lowest temperature. However, the radiation screen should not be connected to the same refrigerator stage as the cold mass. The purpose of the shield is to prevent radiation heat from reaching the surfaces connected to the refrigerator stage with the lowest temperature. The thermal path runs between several positions along the radiation screen and the cooling stage. This reduces the path lengths over which heat is carried-off from the radiation screen to the cooling stage.

These thermal intercept(s) achieve(s) to lower the temperature gradient along the radiation screen. This achieves low power dissipation into the magnet system's cold mass. The more positions at which the thermal intercept is coupled to the radiation screen, forming the thermal links between the thermal radiation screen and the refrigerator, the smaller the average path lengths along which heat needs to be transported along the radiation screen to the cooling stage.

The thermal intercept improves the efficiency of carrying-off heat from the radiation screen. This technical effect is achieved independently from the radiation screen comprising the elongate thermal conductors which reduce temperature gradients along the radiation screen and do no support electrical eddy currents.

The radiation screen according to the invention can be utilized preferably in a magnet system in which the magnet coils are not embedded in a helium tank but individually placed in a vacuum space and held at operating (superconducting) temperature by thermally connecting them to the lowest temperature interface of the refrigerator. Any open spaces between magnet sections provide passageways for thermal interconnections between parts of the radiation screen inside the magnet coils and to the refrigerator located outside the magnet coil.

The thermal intercept may be coupled to the radiation screen in or near the axial mid-plane of the magnet system. The radiation screen may envelope the main magnet coils. The thermal intercept may be coupled at the extremities of the enveloping radiation screen near the axial mid plane and at a position opposite the cooling stage and in or near the mid-plane at the radiation screen. In this way only a small number of thermal couplings between the thermal intercept and the radiation screen is required to establish short thermal pathways from the radiation screen to the cooling stage. This keeps the temperature gradients along the radiation screen low.

The thermal intercept may be a thermally conductive ring that is coaxial with the magnet coil windings. That is the thermally conductive ring is orientated transverse to the longitudinal axis of the magnet system. This embodiment of the thermal intercept may be one or several thermally conductive rings located at axial positions between the magnet coils. The thermally conductive ring may be a solid metal ring with a cross section large enough to keep the thermal resistance between the radiation shield and the refrigerator below 5 K/W. The rings shall have at least one interruption to prevent that it forms a completely closed loop, coupling to the main field magnet or the gradient coils. Alternatively, the thermal intercept may comprise on or more convective loops containing a convective coolant, such as He-vapour. The convective loops may be axially positioned in between the magnet coils. That is the convective loops, or the thermally conductive rings may be placed at axial positions at axial interspaces between the magnet coils.

In another embodiment, thermal insulation blankets surround, at least partially, the main magnet windings and the radiation screen is embedded in the thermal insulation blankets.

The radiation screen of the invention is mechanically weak and electrically non-conducting in one direction. Hence, when mechanically excited by the gradient coil switching of the magnet system, no or only low additional dissipation is caused in the magnet's cold mass. Further, the mechanical flexibility and small mass makes that the thermal radiation screen is easy to manufacture. The anisotropic electrical conductivity suppresses eddy currents due to gradient switching. The minimum thickness of the screen needed to keep the temperature gradients within the screen sufficiently small is strongly dependent on the distance over which the heat has to be transported within the screen. If the conductive elements are made of copper and the mean copper thickness in the shield is 0.5 mm, the temperature drop within the inner bore section of the shield will, for a radiation load of 5 W/m$^2$, be <10K if the magnet length is 1.6 m and there is only one thermal intercept in the mid-plane. With two thermal intercepts, located at ¼ and ¾ of the inner bore screen length, the required mean copper thickness reduces to 0.15 mm.

Such a radiation screen does not need additional mechanical support and may be embedded in the thermal blankets that insulate the magnet windings. Because neither gradient switching nor quenching of the magnet cause significant mechanical forces in the radiation screen, the radiation screen merely needs to carry its own low weight. Thus, the radiation screen may be mounted using only cold jointing techniques and thermal damage to adjacent shielding layers during welding of the radiation screen does not occur.

These and other aspects of the invention will be elucidated with reference to the embodiments described hereinafter and with reference to the accompanying drawing wherein

DETAILED DESCRIPTION OF THE EMBODIMENTS

Figure 1:
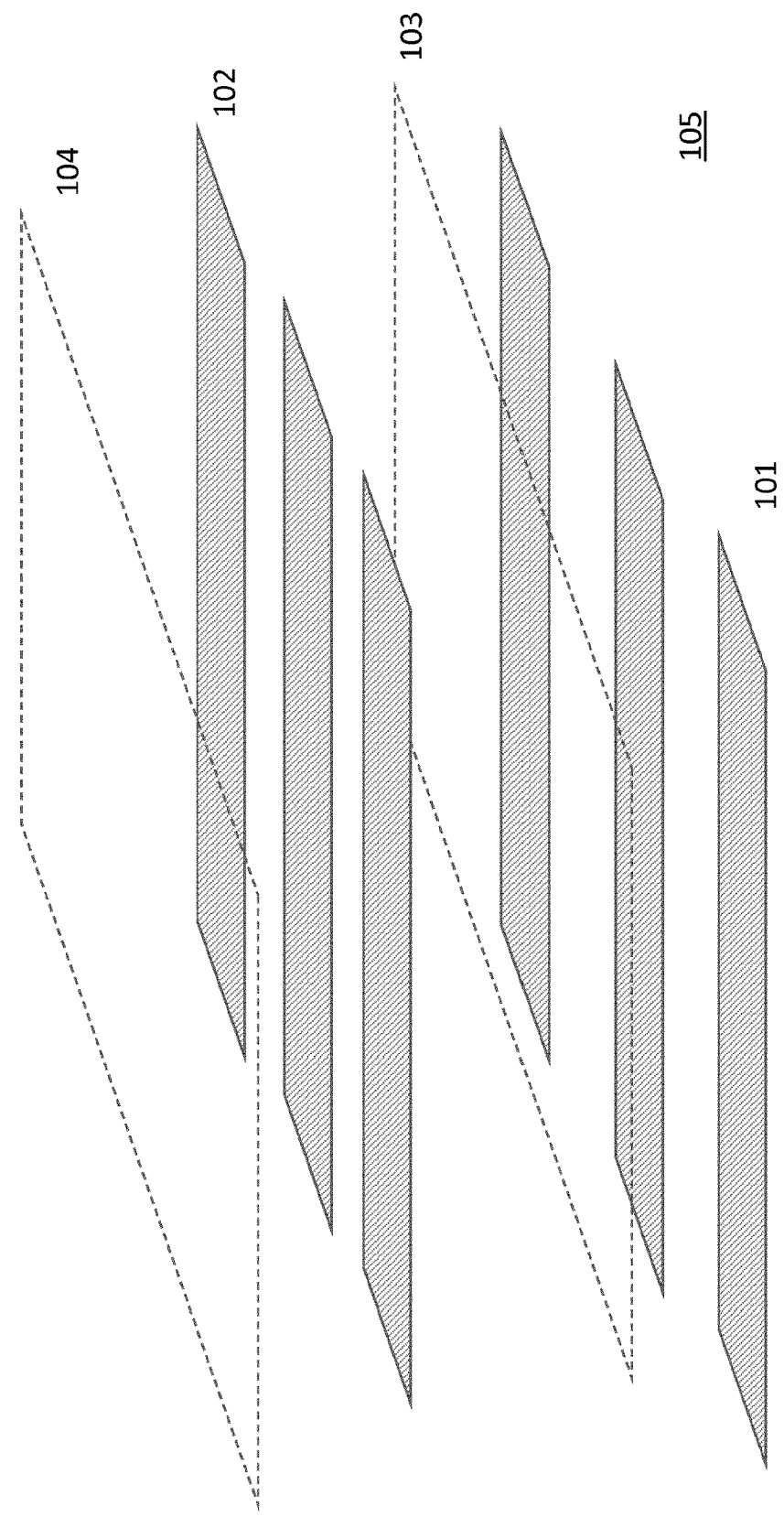
FIG. 1 shows a schematic three-dimensional representation of an example of the thermal radiation screen of the invention.

FIG. 1 shows a schematic three-dimensional representation of an example of the thermal radiation screen of the invention. The radiation screen 105 includes layers 101, 102 of elongate thermal conductors. The elongate thermal conductors of the different layers overlap to some extent both along the lengths of the elongate thermal conductors as well as transversely to their length. As the thermal conductors are elongate, the electrical conductivity in the composite screen is anisotropic in that it is high only along their length and low transverse to the elongate conductors. These may be formed as e.g. strips, tapes, or wires. The anisotropic electrical conductivity achieves that eddy currents due to gradient switching are suppressed. In between respective layers of elongate thermal conductors the opaque layer 103, 104 is disposed to close openings (that allow infrared radiation to pass) between the elongate thermal conductors in the respective layers.

Figure 2:
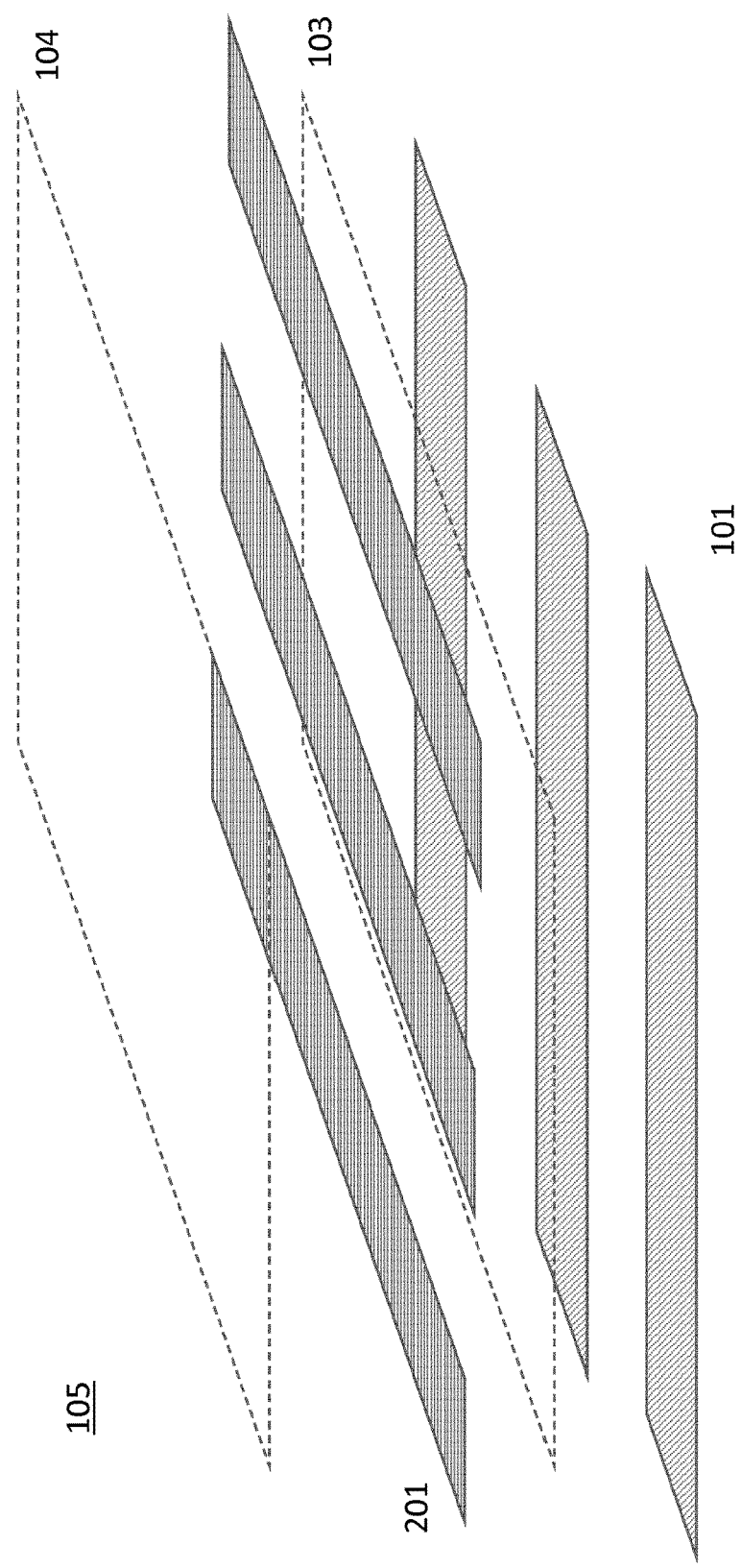
FIG. 2 shows a schematic three-dimensional representation of an another example of the thermal radiation screen of the invention.

FIG. 2 shows a schematic three-dimensional representation of another example of the thermal radiation screen of the invention. In the embodiment of FIG. 2, layers of elongate thermal conductors are stacked with layers of elongate electrically isolators, e.g. electrically non-conducting strips, tapes or wires 201. The elongate thermal conductors shield from heat (infrared radiation) and suppress eddy currents due to gradient switching. The elongate electrical isolators provide for mechanical strength. As in FIG. 2, the elongate thermal conductors and electrical isolators may be covered with an opaque (for infrared radiation) sheet 103, 104. In a variant, the elongate thermal conductors (e.g. wires) and the elongate electrical isolators (fibres) may be combined to form a fabric or cloth.

Figure 3:
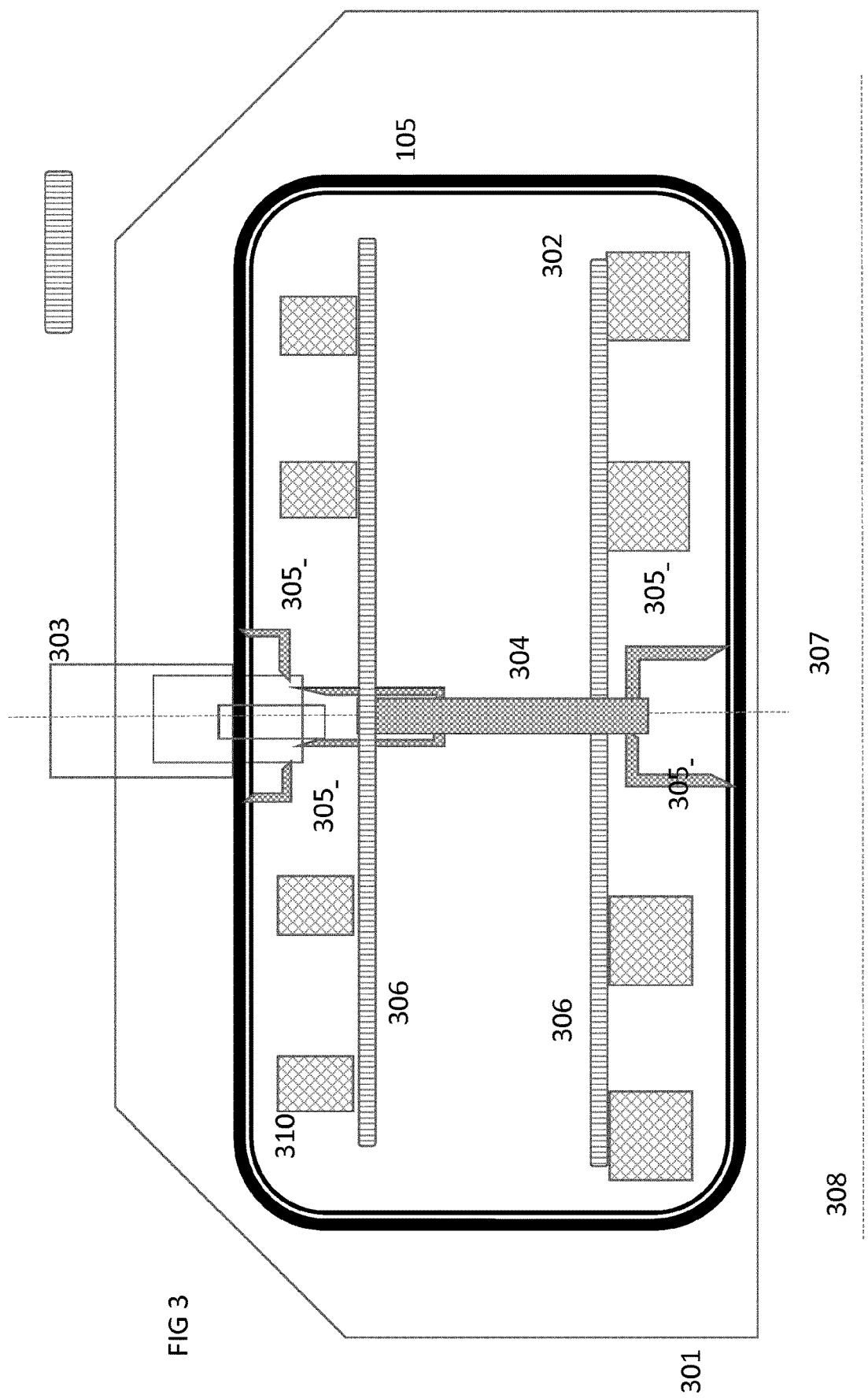
FIG. 3 shows a schematic side elevation of a one example of a magnetic system of an magnetic resonance examination system in which an example of the thermal radiation screen of the invention is incorporated and FIG. 4 shows a schematic side elevation of another example of a magnetic system of an magnetic resonance examination system in which a the thermal radiation screen of the invention is incorporated.

FIG. 3 shows a schematic side elevation of a (portion of) magnetic system of a magnetic resonance examination system in which the thermal radiation screen of the invention is incorporated. The magnet system has cylinder symmetry around the symmetry axis 308. Only the cross section in a plane that contains the rotational symmetry axis is shown at only one side of the symmetry axis.

The magnet system is housed in an outer vacuum container 301 in which the main magnet coils 302 are mounted on a support structure 306. Shielding coils 310 are also provided within the vacuum container 301 and surrounded by the thermal radiation screen 105. Active shim coils (not shown) may also be provided within the vacuum container 301 and surrounded by the thermal radiation screen 105. The thermal radiation screen 105 is arranged around the magnet coils 302 to shield the magnet coils from inwardly irradiated power. The main magnet coils are cooled to below their superconducting transition temperature by a multi-stage refrigerator 303. Further the thermal intercept 304 is thermally coupled to the refrigerator. The thermal intercept is for example a thermally conductive ring axially positioned (with respect to the symmetry axis 308) near the main magnet's mid-plane 307 and coaxial with the main magnet coils. Thermal connections 305 are provided between the thermal intercept and the radiation screen. These thermal connections are placed near the magnet system's mid-plane. Preferably, the thermal connections are axially located between the magnet system's mid plane and the main magnet coil axially closest to the magnet system's mid-plane. As the thermal connections between the thermal radiation screen and the thermal intercept (and ultimately to the refrigerator 303) are near the magnet system's axial mid-plane, the thermal path-lengths between the radiation screen and the refrigerator are kept small or even minimal. This achieves that the temperature gradient along the thermal radiation screen is kept small and heat is carried-off from the thermal radiations screen to the refrigerator efficiently and along short thermal paths.

Figure 4:
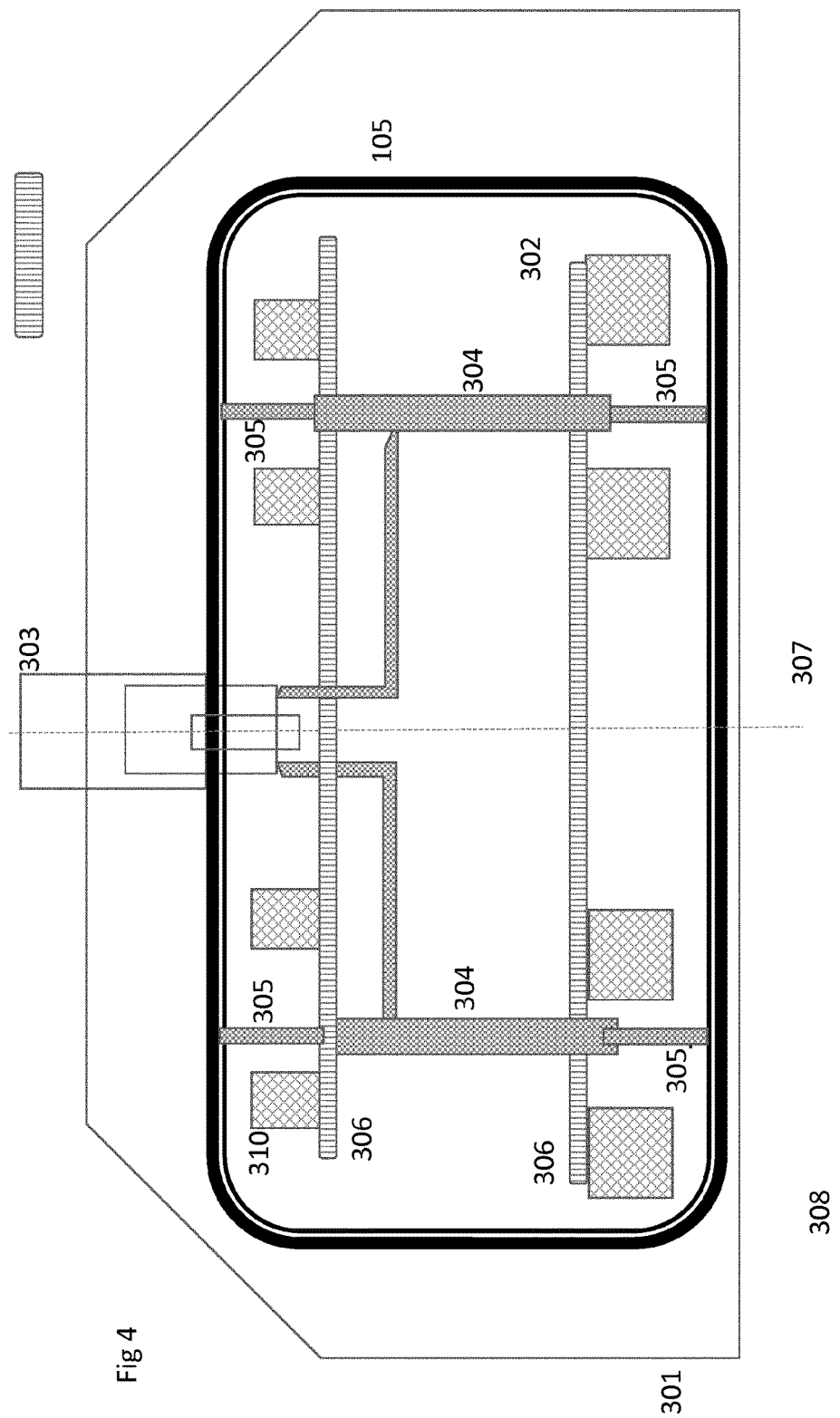

FIG. 4 shows a schematic side elevation of another example of a magnetic system of a magnetic resonance examination system in which the thermal radiation screen of the invention is incorporated. In this embodiment several (two) thermal intercepts 304 are employed. Each of these thermal intercepts are axially positioned in interspaces between main magnet coils (and between shielding coils). Thermal connections 305 link between each of the thermal intercepts and the thermal radiation screen and between each of the thermal intercepts and the stage of the refrigerator. This configuration again leads to short thermal pathways to carry-off heat from the thermal radiation screen to the refrigerator. It is important that, if there is more than one thermal interface to the radiation screen, the connection between the conducting elements and the intercept has to be electrically insulating, so as to avoid building closed loops between conducting shield elements and interface rings. Alternatively, the thermally conducting elements in the shield can be cut at the half way point between thermal interface rings, so as to interrupt any closed conducting paths.

One particular objective of the invention is to make the electrical conductivity anisotropic, such that circulating (eddy) currents are suppressed and to use just enough material for the shield that the temperature gradient across it remains smaller than approximately 20K. An anisotropic electrical conductivity can be achieved by constructing the shield from numerous tapes or wires, electrically insulated from each other and running predominantly in the axial direction of the magnet. The shield is to be made opaque for infrared radiation by overlapping these conducting elements, and/or by adding a non-conducting opaque layer thermally connected to the conducting elements. Alternatively, it can be manufactured as a fabric using thermally conducting fibres in one direction and non-conducting fibres in the perpendicular direction. In order to minimize the distance over which the heat has to travel through the shield towards the thermal intercept, it is advantageous to provide at least one ring-shaped thermal bus, connected to the refrigerator, on the inner bore part of the screen at or near the mid-plane of the magnet. Assuming a magnet half-length of 0.75 m, a radiation heat load of 5 $W/m^2$ can be conducted from the inner bore part of the screen with a maximum temperature drop of 15K when the conducting elements are made from copper with an average thickness of 0.3 mm. Such a screen would be light enough that it does not need additional mechanical support; it can simply be embedded between layers of multi-layer insulation. The outer part of the screen can be constructed in a similar way and thermally connected to a second ring-shaped thermal intercept located in the midplane of the magnet. Here a maximum temperature gradient of less than 20K can be achieved with a total thickness of the conducting elements in the shield of less than 1 mm (copper). Note that neither gradient operation nor a quench of the magnet cause significant mechanical forces in the shield; therefore the shield or whatever supports the shield only has to carry its own weight. There is no need for a thermal/mechanical joint where the inner and outer parts of the screen meet, it is sufficient to ensure (e.g. by overlapping or using adhesive tape) that no radiation window is left open at this point. Thus it is possible to install the shield using cold jointing techniques, not requiring any special skills from the technician and avoiding thermal damage to adjacent layers of the insulation system during magnet assembly.

It is advantageous to extract the heat from the magnet bore part of the radiation screen by means of at least one thermal bus located in the mid-plane of the magnet but does not detail how this thermal bus can be constructed. For the anticipated 5-10 watts of heat to be transferred, a thermal link consisting of copper bars or braids is feasible but would require a large amount of thermally conducting material.

It is advantageous to extract the heat out of the radiation screen by means of a convective helium loop, similar to how the heat is removed from the magnet coils in the conventional cryo-free magnet concept. Such a convective loop consists of a tube making one turn around the radiation screen and thermally anchored to the radiation screen. At its upper end, this tube is part of a heat exchanger connected to the first (~40K) stage of the refrigerator. The tube is filled with helium gas. The cooled gas in the heat exchanger has a higher density; gravity makes it flow down towards the shield where it extracts heat, which makes the gas expand.

Instead of having a single such cooling loop in the mid-plane of the magnet, it is advantageous to install at least two additional such cooling loops, which are then preferably located in the gaps adjacent to the outermost coil sections of the magnet. The cooling loops can be mechanically anchored to the cold mass of the magnet by means of low thermal conductivity support elements.

If the mean distance between cooling loops is of the order of 300 mm or less, the effective thickness of the radiation screen can be reduced to approximately 0.1 mm if it is made from of a texture of uniaxial copper wires.

It is possible to connect the outer surface of the radiation screen to the first stage of the refrigerator also by means of a set of convective helium loops, instead of by the conventional bundle of flexible copper wires. The advantage of using helium-filled tubes would be mainly a reduction of weight and cost.

The invention claimed is:

1. A thermal radiation screen for a magnet system comprising a multitude of overlapping elongate thermal conductors that are electrically conductive, including:
   at least one thermally non-conducting opaque layer that is non-transparent in the infrared wavelength range and is arranged in between or covering the elongate thermal conductors and
   the thermally non-conducting opaque layer being in thermal contact with at least some of the elongate thermal conductors.

2. The thermal radiation screen of claim 1, wherein an individual thermally non-conducting opaque layer is formed from elongate thermally insulators disposed on a continuous opaque sheet.

3. The thermal radiation screen of claim 2, further including a fabric formed from thermally conducting fibres and electrically non-conducting fibres, the thermally conducting fibres being orientated transversely to the electrically non-conducting fibres.

4. A magnet system for an magnetic resonance examination system, the magnet system comprising:
   main magnet coils with coaxial windings to generate a main magnetic field in the magnetic resonance examination system's examination zone,
   a refrigerator having a cold head to cool the main magnet coil windings below critical temperature for superconductivity,
   a thermal radiation screen as claimed in claim 1 surrounding the main magnet coils, and
   a thermal intercept arranged forming a thermal path between the thermal radiation screen and the refrigerator, the thermal intercept being thermally connected at several positions to the radiation screen.

5. The magnet system of claim 4, wherein the cold head and the thermal intercept are arranged at or near the magnet system's axial mid-plane and the thermal intercept is thermally connected to the radiation screen at or near the axial mid-plane.

6. The magnet system of claim 4, wherein the thermal intercept is ring-shaped and coaxial with the magnet coil windings.

7. The magnet system of claim 4, wherein the thermal intercept is formed by a convective loop containing a convective coolant.

8. The magnet system of claim 7, wherein the thermal intercept is formed as several convective loops at axial positions between interspaces between the magnet coils.

9. The magnet system claim 4, wherein the main magnet windings are surrounded by one or more thermal insulation blankets and the thermal radiation screen is embedded in the one or more thermal insulation blankets.

10. The magnet system of claim 4, wherein the radiation screen is non-structural and is supported by one or more multi-layer insulation blankets.

11. The magnet system of claim 7, wherein the convective coolant is helium.

12. A magnet system for a magnetic resonance examination system, the magnet system comprising:
   one or more main magnet coils with coaxial windings to generate a main magnetic field in an examination zone,
   a refrigerator having a cold head to cool the main magnet coil windings below critical temperature for superconductivity,
   a thermal radiation screen surrounding the main magnet coils, wherein the thermal radiation screen includes:
   at least one thermally non-conducting opaque layer that is non-transparent in the infrared wavelength range and is arranged between or covering one or more overlapping elongate thermal conductors that are electrically conducive, the thermally non-conducting opaque layer being in thermal contact with at least some of the elongate thermal conductors, and
   a thermal intercept arranged forming a thermal path between the thermal radiation screen and the refrigerator, the thermal intercept being thermally connected at one or more positions to the radiation screen.

13. The magnet system of claim 12, wherein the cold head and the thermal intercept are arranged at or near the magnet system's axial mid-plane and the thermal intercept is thermally connected to the radiation screen at or near the axial mid-plane.

14. The magnet system of claim 12, wherein the thermal intercept is ring-shaped and coaxial with the magnet coil windings.

15. The magnet system of claim 12, wherein the thermal intercept is formed by a convective loop containing a convective coolant.

16. The magnet system of claim 12, wherein the thermal intercept is formed as several convective loops at axial positions between interspaces between the magnet coils.

17. The magnet system claim 12, wherein the main magnet windings are surrounded by one or more thermal insulation blankets and the thermal radiation screen is embedded in the one or more thermal insulation blankets.

18. The magnet system of claim 12, wherein the radiation screen is non-structural and is supported by the one or more multi-layer insulation blankets.

* * * * *